United States Patent [19]
Adishian

[11] Patent Number: 6,020,636
[45] Date of Patent: Feb. 1, 2000

[54] KILOWATT POWER TRANSISTOR

[75] Inventor: Gary C. Adishian, Scottsville, N.Y.

[73] Assignee: ENI Technologies, Inc., Rochester, N.Y.

[21] Appl. No.: 08/957,100

[22] Filed: Oct. 24, 1997

[51] Int. Cl.[7] .......................... H01L 23/48; H01L 23/492
[52] U.S. Cl. .......................... 257/728; 257/732; 257/723; 257/724
[58] Field of Search .................................. 257/578, 584, 257/723, 724, 725, 732, 728

[56] References Cited

U.S. PATENT DOCUMENTS

| | | | |
|---|---|---|---|
| 4,788,584 | 11/1988 | Hirano et al. | 257/728 |
| 5,309,014 | 5/1994 | Wilson | 257/584 |
| 5,503,286 | 4/1996 | Nye, III et al. | 216/13 |
| 5,744,861 | 4/1998 | Bayerer | 257/691 |

*Primary Examiner*—John Guay
*Attorney, Agent, or Firm*—Bryan Cave LLP

[57] ABSTRACT

A high-power high-voltage transistor has four or more semiconductor dies mounted in thermal contact on a metal flange. Each die has a flat lower surface with a drain (collector) region formed over at least 80 percent of its lower surface. A gate (base) region and a source (emitter) region are formed respectively on upper surfaces of the die. The drain region is seated in direct electrical and thermal contact with the flange, so that the flange serves as a drain lead for the transistor die. The die has a drain-source breakdown voltage or collector-emitter breakdown voltage) on the order of one kilovolt or higher and an area of one hundred thousand square mils or larger. Molybdenum tabs between the drain (collector) region and the flange protect the die from thermally-induced stresses. The dies can be MOSFET power transistors, bipolar junction transistors or other solid-state devices. An oval lead frame can be employed for connecting to the source regions. A carousel arrangement carries an array of chips on a circular flange. The transistor can be implemented as a DC grounded drain, RF common source amplifier circuit. The gate-source input can float, allowing the drain to be DC and thermally grounded. The RF current path is conventional common source (emitter).

11 Claims, 11 Drawing Sheets

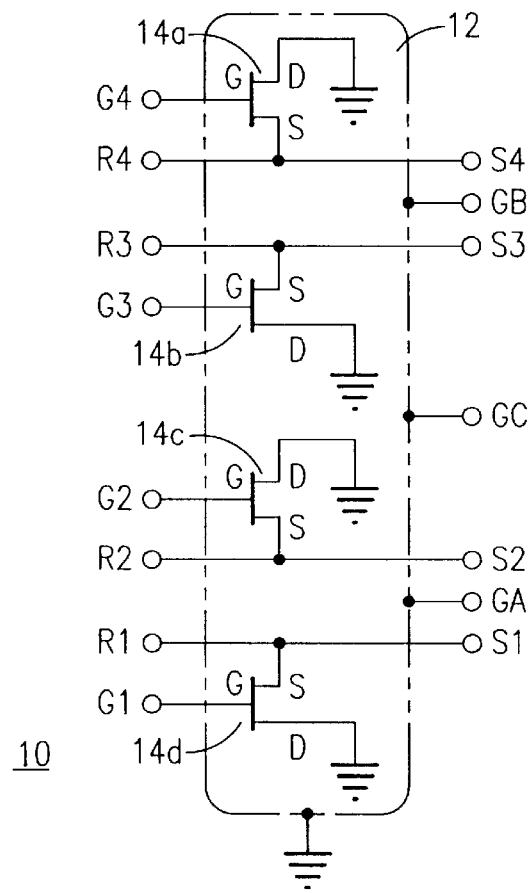
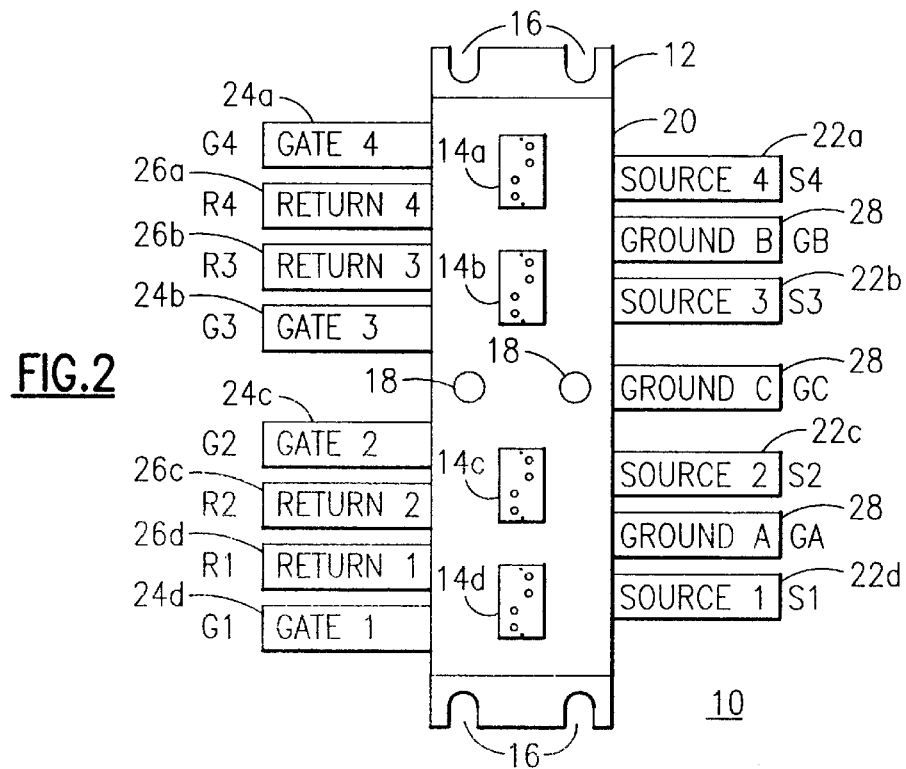
FIG.1
FIG.2

[F] = DISSIPATIVE
BANDPASS FILTER
(SEE FIG. 10A OR 10B)
[N] = IMPEDANCE-
TRANSFORMATION
NETWORK

KILOWATT POWER TRANSISTOR

BACKGROUND OF THE INVENTION

This invention relates to high power high voltage transistors, and is particularly directed to a transistor structurally and electrically configured for very high power, high efficiency amplification of radio frequency (RF) energy in the MF-HF-VHF RF spectrum. The invention is more particularly concerned with a transistor capable of providing output power of between one and several kilowatts in RF applications without problems of heat dissipation and with minimal complexity of circuitry. The invention is independent of any one particular transistor technology (BJT, FET, IGBT) or any particular class of operation (A, AB, B, C, D, E, or F).

In conventional HF and VHF high power RF amplifiers, the final power stage transistors are traditionally configured as RF common source (FET) or RF common emitter (BJT). The common source (or emitter) terminal is grounded with respect to both the input and output RF current paths, and therefore the opposite polarity DC electrode, namely the drain (or collector) terminal must be electrically isolated from ground. This requires either internal or external insulators. As a result, any associated heat developed in the transistor die must pass through an electrically insulating layer to reach the associated heat sink. This layer, being a dielectric, increases the capacitance between the drain and ground (or between the collector and ground). Optimally thin insulating layers are less of a barrier to heat transfer; therefore, very thin ceramic insulators are traditionally used, such as beryllium oxide (BeO), aluminum nitride (AlN), or thin diamond film. However, at substantially high power levels even these create an unacceptably large thermal gradient: this limits the available reliable power for a given transistor die. Also, the high dielectric constants exacerbate the drain-to-ground capacitance, limiting the performance at the higher RF frequencies.

Conventional HF high power RF amplifier stages are typically operated at moderately low voltages of 12 to 50 volts. Therefore, the associated high currents generate I-squared-R heating of the transistor and its interconnecting RF circuits, and their integral passive circuit elements. It has not been possible previously to reliably reduce this heating problem, simply by using higher voltages and lower currents. Conventional prior-art RF power generators employ multi-chip internally isolated transistor arrays, as shown in Table A, below. This necessitates operating at higher temperatures. Because the prior-art transistors employ ceramic insulators between the die and mounting flange, adequate thermal management to adjacent heat sinks continues to be a critical problem.

OBJECTS AND SUMMARY OF THE INVENTION

It is an objective of this invention to provide a structurally, both thermally and electrically optimized and improved very-high-power transistor suitable for producing a reliable high-power, high-efficiency RF output, at high operating voltages, under continuous duty and adverse load mismatch conditions.

It is a more specific object of this invention to provide a power transistor with high thermal conductivity between the transistor die and an associated heat sink, to permit problem-free reliable high power performance.

It is another object of this invention is to provide a simple, yet powerful RF amplifier circuit employing the technical benefits derived from a transistor structure and supporting circuit configured for Grounded-Drain (or Grounded-Collector)/RF Common Source (or Common Emitter) operation.

According to an aspect of the invention, a high-power transistor is based on a semiconductor die mounted on a thermally and electrically conductive flange. The flange, typically machined from copper, has flat upper surfaces and the semiconductor die has a flat lower surface with a drain electrode contact metallization region formed over a large part of the lower surface. A gate metal region and a multiple metallization pattern (or bond pad) source region are formed respectively on portions of said die away from the flat lower surface; a source lead isolated from the flange is electrically connected to the source region and a gate lead isolated from the flange is electrically connected to the gate region. The heat-generating drain region is seated in electrical and thermal contact with the flange, so that the flange serves as a drain electrode for the transistor die. The die has a drain-source breakdown voltage on the order of one kilovolt or higher; the flat surface of the transistor die has a nominally large area of one hundred thousand square mils or larger; and the drain region is metallized over substantially its entire surface. Preferably, a molybdenum tab is interposed between the drain region and the flange. The molybdenum tab has a coefficient of thermal expansion close to that of silicon, and protects the die from thermal stresses induced from changes in power. At the same time, the molybdenum tab is a good conductor of heat and electricity. In a preferred embodiment, there can be four transistor dies mounted in a co-linear symmetrical arrangement on the flange. Alternatively, there may be a different number of dies in a transistor package. The invention is independent of any particular transistor technology, as described in reference to Table A and Table B, below, and applies equally to a 1.25 KW device, a 3.0- KW device, and higher power devices. The invention applies equally to FETs of both MOSFET and Junction FET (J-FET) types; to Bipolar Junction (BJT) types, transistor devices of both single and compound "power darlington" types, and to insulated gate bipolar (IGBT) types. The materials technology can include silicon, silicon carbide, or other materials. The transistor device terminals in this description, and in the claims to follow, are termed broadly to encompass the three principal electrodes, as used in Table B.

TABLE B

| Transistor Technology | Terminal No. 1 | Terminal No. 2 | Terminal No. 3 |
|---|---|---|---|
| FET | gate | source | drain |
| BJT | base | emitter | collector |
| IGBT | gate | emitter | collector |

It should be noted that in all the examples, the control electrode is Terminal No. 1, the principal heat-generating electrode is Terminal No. 3, and the common electrode is Terminal No. 2.

According to two possible embodiments of this invention, the power stage for an RF amplifier can be based on transistors of either a 4-chip or a 9-chip structure, configured for grounded drain, RF common source operation. DC source voltage, e.g., "minus" 160 VDC (for a negative polarity N-channel device), is applied to the source electrode via an RF choke, and the RF drive signal is applied to the gate electrode. Because the drain is grounded, the drive signal return current path is floated in respect to ground. In one preferred example, the transistor is a MOSFET N-channel device. However, the transistor could comprise a P-channel device, in which the various bias voltages would be reversed. As aforementioned, the transistor could also be a BJT, either NPN or PNP.

The above and other objects, features, and advantages of this invention will become apparent from the ensuing description of a preferred embodiment, which should be read in conjunction with the accompanying Drawing.

BRIEF DESCRIPTION OF THE DRAWING

FIG. 1 is a schematic diagram of a 4-chip array Kilowatt RF power transistor (not connected in circuit) according to an embodiment of this invention.

FIG. 2 is a plan view of the transistor of this embodiment.

DETAILED DESCRIPTION OF THE PREFERRED EMBODIMENT

Figure 3:
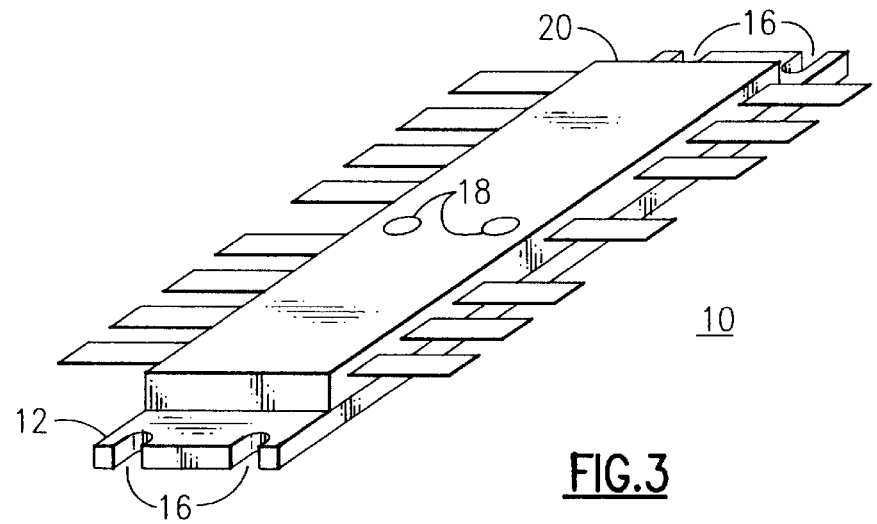
FIG. 3 is a perspective view of the transistor of this embodiment.

With reference to the Drawing figures, and initially to FIGS. 1 to 3, a kilowatt power transistor 10 has a flat metal flange 12 or base, which mounts on a suitable heat sink (not shown) that can be formed as part of the chassis of an amplifier. The transistor is a quad- or four-chip array design, with four transistor chips or dies 14a, 14b, 14c, 14d mounted on the flange 12, and with their respective drain regions D grounded to the flange 12. Each transistor die has a respective gate G1 to G4 and a respective source S1 to S4. The sources are connected also to source return leads R1 to R4, as shown. The flange 12 is provided with either end slots or holes 16 and mounting through holes 18 for attaching to an associated heat sink HS. A plastic or similar case 20 covers the four dies 14a to 14d, and leaves the two ends of the flange 12 exposed. The flange 12 itself serves as the grounded drain lead or electrode for each of the four transistor elements, supplemented by additional ribbon leads 28 intended to connect to the external RF circuit grounds. The ribbon source leads 22a to 22d, gate leads 24a to 24d, and source-return leads 26a to 26d (these are tied to the respective source leads) complete the RF electrode terminals. These leads 22, 24, 26, 28 are crimped near their exit from the sides of the case 20 to provide strain relief for the respective leads.

Figure 4:
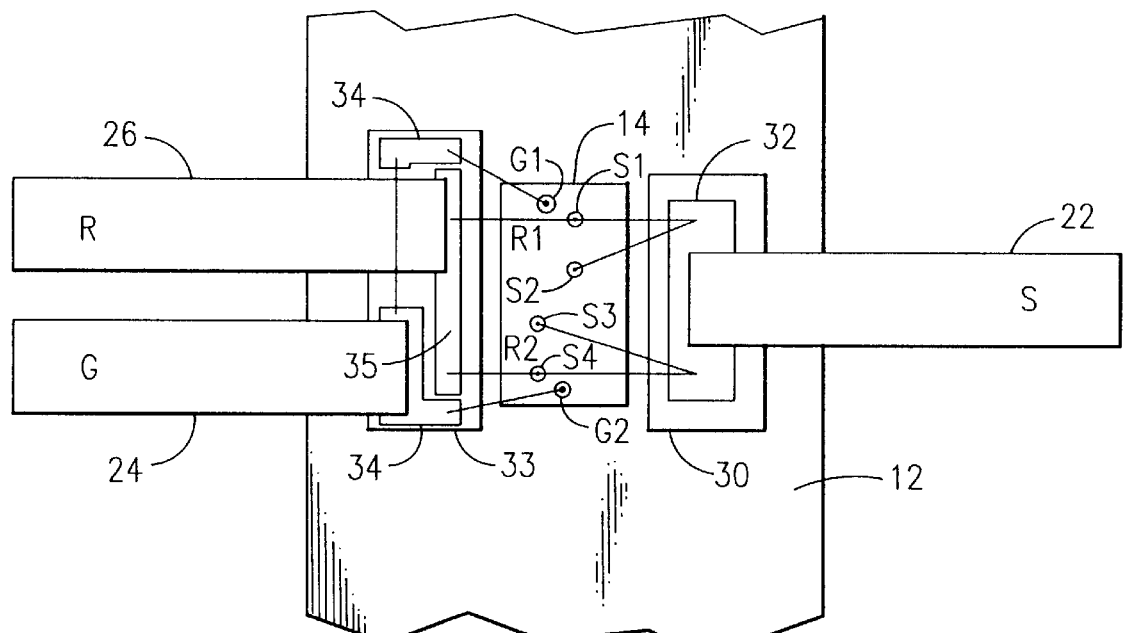
FIG. 4 is a plan showing detail of one chip and wire interconnect of this embodiment.

A somewhat symmetrical and moderately optimum low-reactance bonding and wire configuration for a single chip 14 of the four-chip transistor 10 is illustrated in FIG. 4. Here, one of the dies 14, in this case a semiconductor FET chip, is shown with four source regions (shown as four spots on the top surface of the die) and a pair of gate regions. The reverse or back side drain metallization is in contact with the metal base or flange 12, via a molybdenum flange (not shown in this view). An output ceramic insulator or standoff 30 has an integral metallization or pad 32 on which the source lead 22 is affixed. Bond wires connect each of the source regions to the source pad 32. An input ceramic insulator 33 is positioned on the opposite side of the die 14 and has integral gate metallization 34 on which the gate lead 24 is affixed, and has a source-gate return metallization 35 on which the source-gate return lead 26 is affixed. There are bond wires connecting each of the gate metallizations 34 to one another and to the gate regions, and bond wires connecting the return metallization 35 to the source metallization 32 and the source regions on the die 14. The return lead is used for applying the gate-source input signal between the gate and source, which only requires that the gate input be configured to float in respect to the drain, i.e., in respect to ground. Additionally, the ground or drain leads 28 (See FIG. 2) can be soldered directly to the flange, or alteratively can be connected by bond wires to pads or tabs that are soldered onto the flange 12. The cover is positioned over the ceramic insulators 30, 33 and the semiconductor dies 14, and is affixed onto the flange 12.

Figure 5:
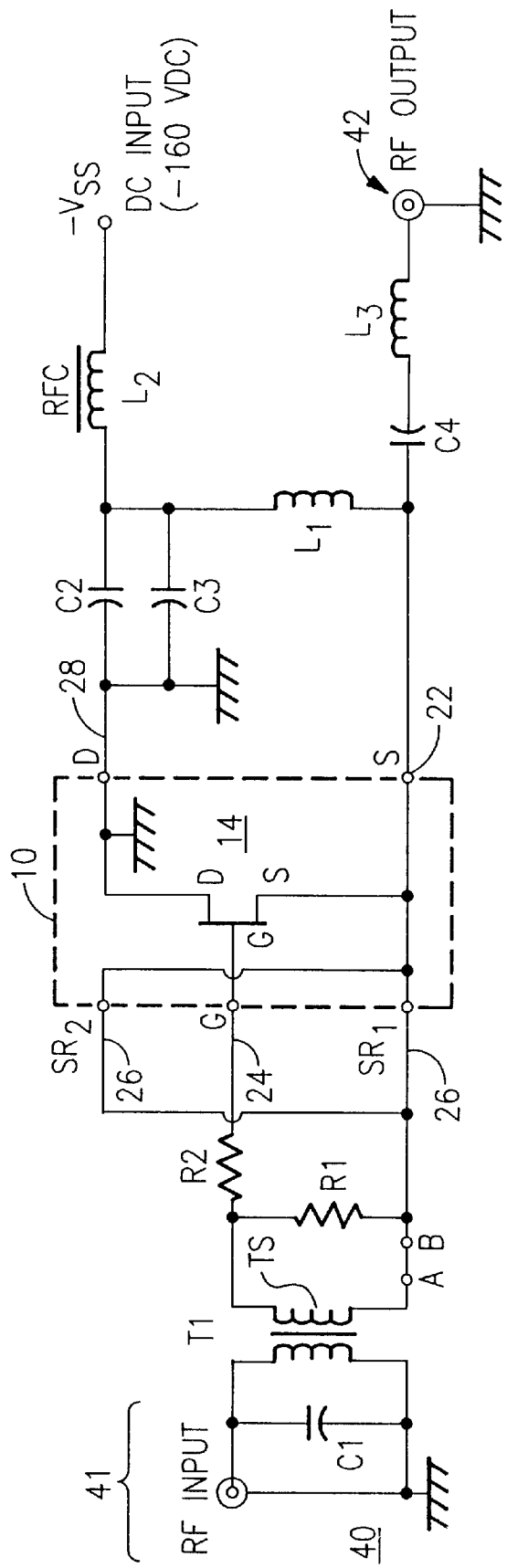
FIG. 5 is a circuit diagram of a typical circuit for testing a chip of this device.

A preferred amplifier arrangement is illustrated in FIG. 5, showing one of the four dies 14 of the transistor 10. Here, an amplifier circuit 40 is configured as DC grounded drain, RF common source. The drain terminal D is grounded (i.e., to the flange 12) and the source S is coupled both as output and as source-gate return. Here, the input signal applied between the gate and source electrodes is obtained by floating the input signal in respect to ground, i.e., drain. An RF input 41 has a grounded outer terminal and an inner terminal. An input capacitor C1 and a primary winding of an input transformer T1 are connected between the input center terminal and ground. An input resistor R1 promoting RF stability (i.e., inhibiting spurious operation) is connected between two end taps of a secondary winding TS of the transformer T1 and a gate resistor R2 also optimizing RF stability is connected between one end tap and the gate 24 of one of the four dies 14 of the transistor 10. The other end of the secondary TS is joined to a pair of source-return leads 26 of the transistor. At the output side of the transistor 10, the drain or ground lead 28 is followed by a parallel pair of drain capacitors C2, C3, and an inductance L1 joined between the other side of the capacitors C2, C3 (i.e., remote from ground) and the source lead 22 of the transistor 10. A radio-frequency choke coil L2 connects the drain capacitor side of the inductance L1 to a source of DC voltage-$V_{ss}$. The source lead 22 is connected by means of capacitor C4 and inductor L3 to an RF output terminal 42. The L3-C4 series-connected network operates just off resonance. This network enhances efficiency as needed for some applications. In other applications, the elements L3-C4 are replaced with a single DC blocking capacitor (not shown).

Figure 6:
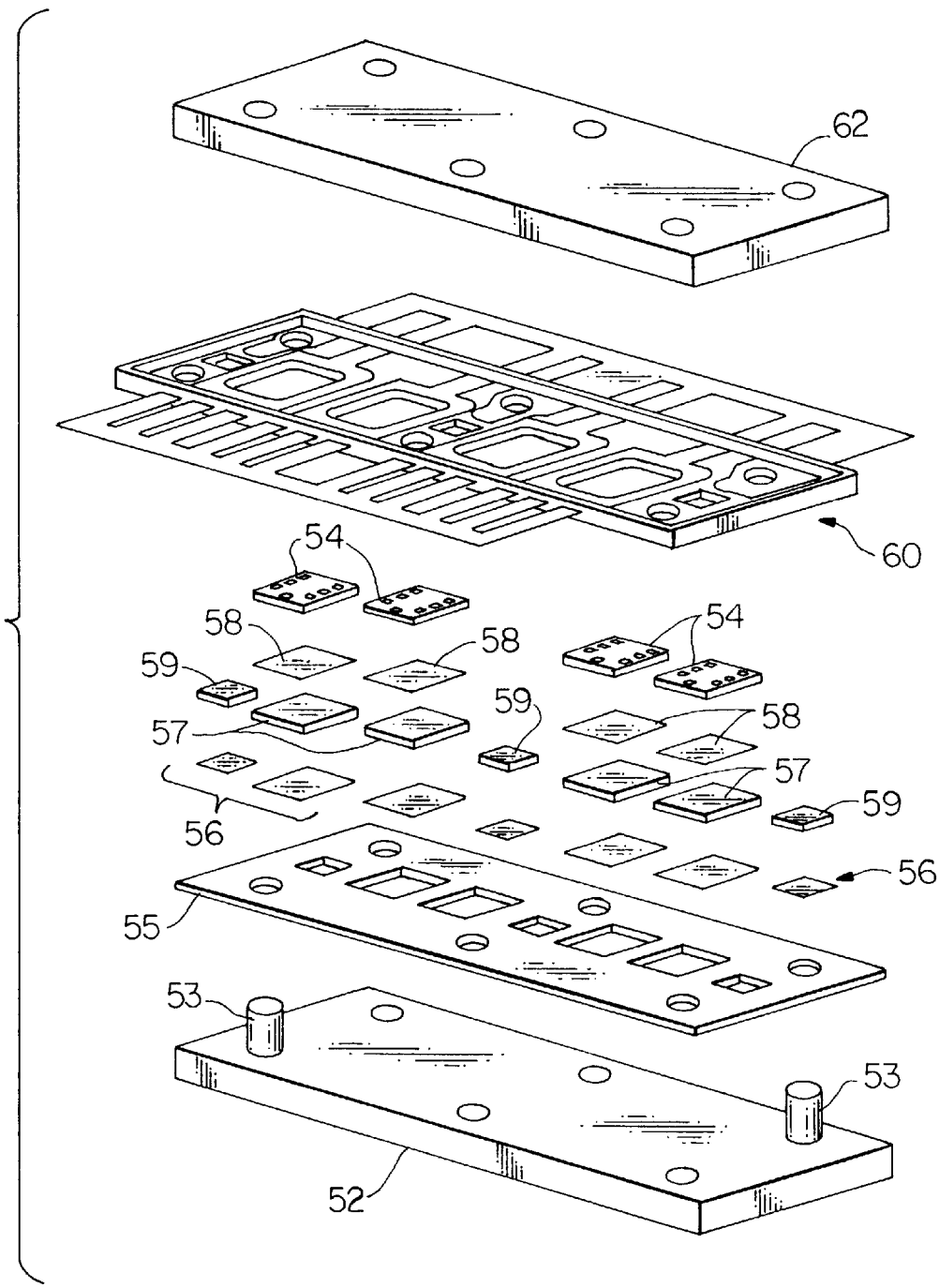
FIG. 6 is an exploded assembly view of a 4-chip array Kilowatt RF power transistor of another embodiment.
Figure 7:
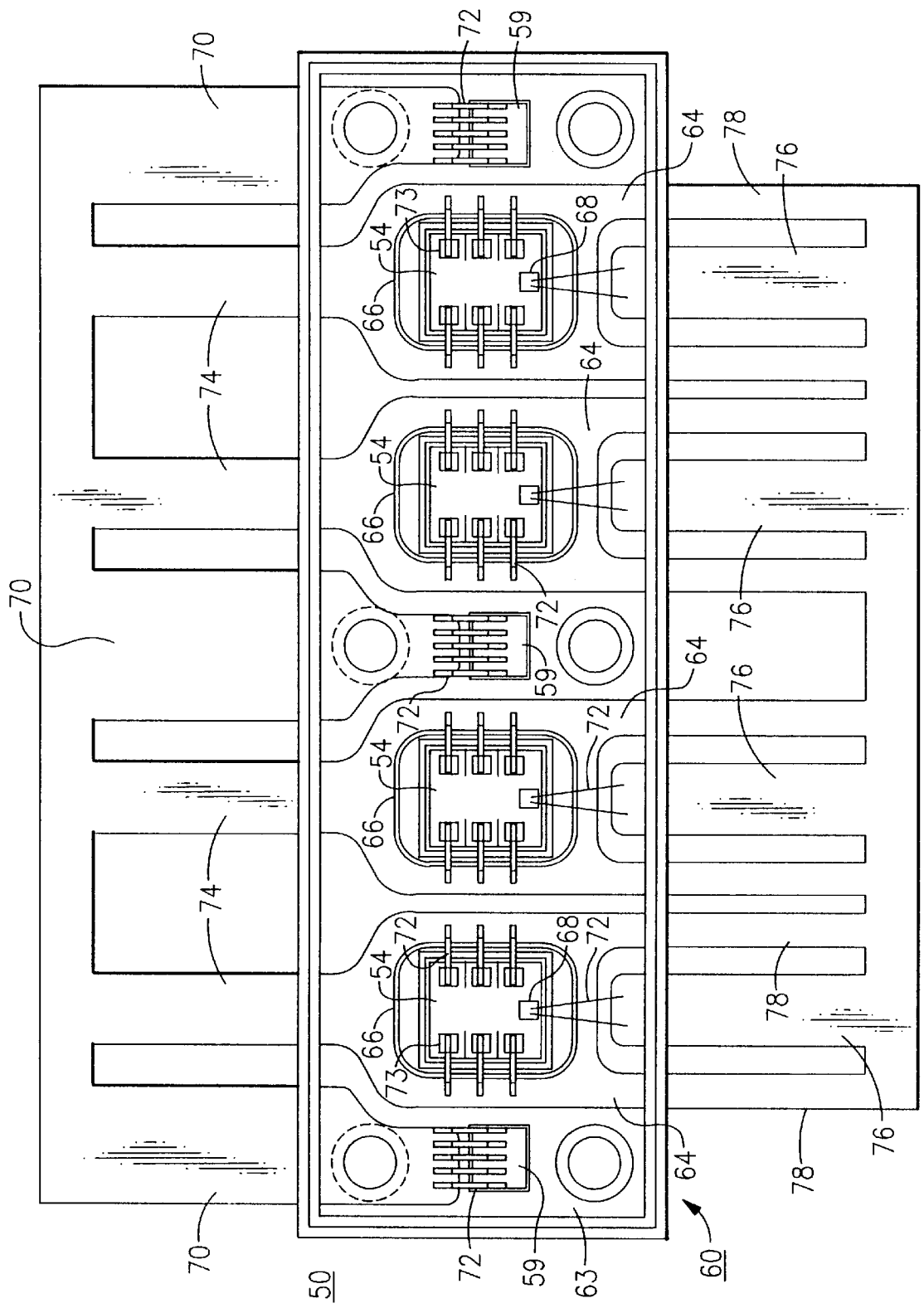
FIG. 7 is a plan view of the transistor of FIG. 6.

A second embodiment of a four-chip transistor 50 according to the present invention is shown in FIGS. 6 and 7. In the exploded assembly view of FIG. 6, a flange or base 52 is formed of copper clad with nickel, and is fitted with a pair of alignment posts 53. The four dies 54 can be N-channel MOSFET silicon chips, or can alternatively be bipolar junction transistor silicon chips. A die attachment fixture 55 is positioned over the alignment posts 53 onto the flange 52. Solder preforms 56 are positioned in place in respective openings in the fixture, followed by molybdenum tabs 57 and then upper solder preforms 58 for the respective dies 54. Smaller molybdenum tabs 59 are used as pads for drain bond wires, to be discussed later.

The attachment fixture 55 is removed once the dies 54 and tabs 57, 59 are affixed in place onto the flange 52, and then a molded lead frame 60 is positioned in place on the flange, using the alignment posts 53. A cover 62 is provided to fit over the lead frame once the required connections are established, and the alignment posts removed.

As shown in more detail in the plan view of FIG. 7, the molded lead frame 60 has a plastic body 63 dimensioned to fit over the flange 52, and four oval-shaped conductive frames 64, each in the form of a metal surround, i.e., a metal ring that surrounds a respective oval opening 66. The opening 66 fits over the respective semiconductor die 54 but out of contact therewith. Gate terminal pads 68 each extend inward towards one side of the respective dies 54. Ground (i.e., drain) leads 70 are positioned at intervals on the other side of the lead frame 60 and at the positions of the ground tabs 59. Bond wires 72 of suitable gauge (typically 15 mil diameter) join the tabs 59 to the ground leads 70, as shown. Also, similar bond wires 72 connect the oval frame 64 to respective metallized source regions 73 on the dies 54 (here, six source regions per die are shown), and a pair of bond wires 72 also connect each gate terminal pad 68 to the metallized gate region of the die. Each oval lead frame region 64 has a source lead 74 that extends from one side of the plastic body 63, and a pair of source-return leads 78 on the other side of the body 63. The source-return leads 78 are separated, and lie on either side of a gate lead 76 that extends from the gate terminal pad 68. This forms a symmetrically balanced return current path. The cover 62 is cemented or bonded in place over the lead frame 60 to complete the transistor construction.

In this embodiment, no ceramic insulators, metallized substrates or standoffs are used, which simplifies construction and reduces part count. The lead frame structure described yields a highly symmetrical low parasitic reactance structure. This promotes amplitude and phase coherence and balance in amplification of the RF signal. The drawing views show the outer ends of the lead ribbons being joined together, during the beginning of the manufacturing or construction process. The outer bars on these lead ribbons are removed prior to installation of the transistor 50. As an alternative to the plastic body 60, a ceramic or similar dielectric substrate could be used. The metal frame can be printed onto the insulator body.

Figure 8:
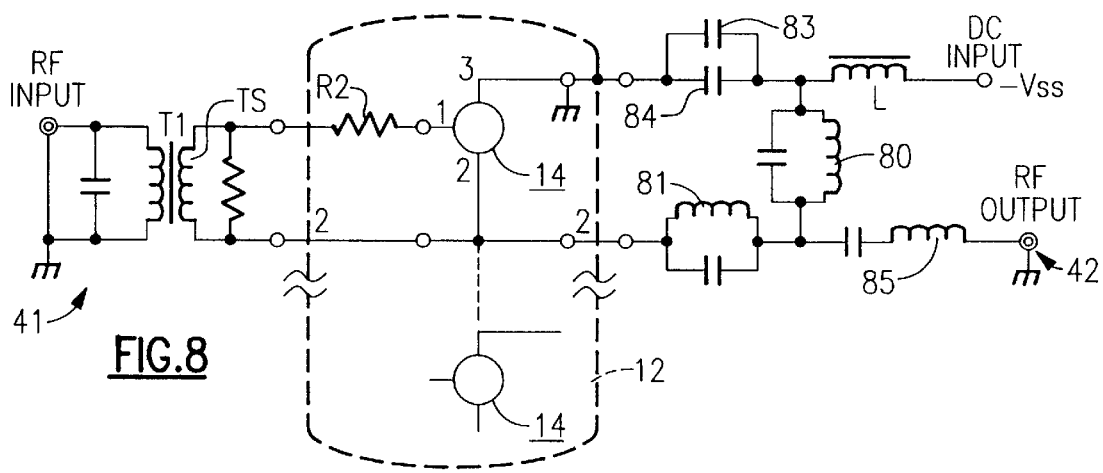
FIG. 8 is a schematic circuit diagram showing the RF current and signal paths of a single chip of any embodiment of this invention.
Figure 9:
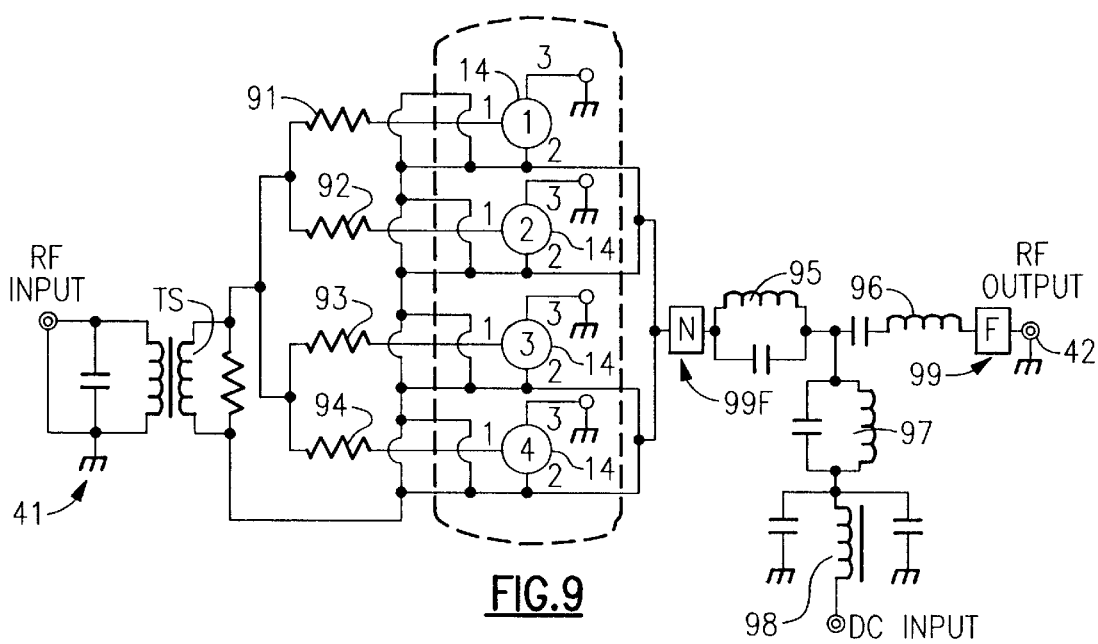
FIG. 9 is a schematic circuit diagram of one possible implementation for any 4-chip array transistor.

In the Kilowatt power transistors 10, 50 of this invention, at a DC voltage of −160 V, each die 14, 54, when operated e.g., in the circuit of FIG. 8, with a 50 ohm load, develops a minimum RF power output of over 500 watts at maximum efficiency, typically a peak efficiency of 85% or more. This corresponds to a rated RF power output of 350 watts per die, allowing for a standard 44% power margin. When the four transistor dies 14 or 54 are operated coherently, as intended, and as shown in the circuit of FIG. 9, that is, in balanced amplitude and phase, the combined output power of a quad Kilowatt Power Transistor 10 or 50, at a similar DC voltage (−160 V) into a suitable 50 ohm load, is 1.80 kilowatts minimum RF power output at maximum efficiency. This corresponds to 1.25 kilowatts rated RF power output for the 44% power margin. By achieving a 44% power margin, the Kilowatt Power Transistor develops the forward power to drive the worst phase of mismatched loads in accordance with Table C. Because both forward power output and efficiency degrade with increasing load mismatch power reflection, the associated device power dissipation increases. This increases the device die temperature, but because of the superior thermal structure described, far less than the prior art devices shown in Table A.

TABLE C 1.25 kW Kilowatt Power Transistor - Worst Phase
Forward Power Output vs. Load Mismatch Magnitude

| Load Mismatch Magnitude | | Worst Phase Forward Power |
|---|---|---|
| VSWR | Power Reflection | Power Output |
| 1.0 | 0.0% | 1.800 kW |
| 1.5 | 4.0% | 1.250 kW |
| 2.0 | 11.1% | 1.012 kW |
| 3.0 | 25.0% | 0.800 kW |
| 5.0 | 44.4% | 0.648 kW |
| 10.0 | 66.9% | 0.544 kW |
| 30.0 | 87.5% | 0.480 kW |
| ∞ | 100% | 0.450 kW |

The high operating voltage capability of the dies 14 or 54 may be achieved by using a high-resistivity epi layer, or Rho-T product silicon material. These dies may typically have a source-drain breakdown voltage of 1000 volts, and operate well in a source-drain voltage range of 160 V to 200 V. Consequently, high power is achieved using relatively low current, typically at about 2.5 amperes per die. This configuration also achieves good RF ground and dynamic operating range, without compromising RF ruggedness and RF stability, as may be demanded by the severe requirements of an RF plasma load. The large associated RF breakdown voltage margins permit sustained operation even under severe, near open circuit load mismatches. The relatively low (typically 2.5 A) DC current per chip, resulting from higher operating voltages, also brings about a reduction in I-squared-R heating of the dies. This fact, combined with the direct heat sinking of the large metallized drain region into the flange, keeps the transistor dies operating cooler than prior-art amplifiers, thus eliminating thermal problems. The high voltage 350 watt per chip configuration also achieves a higher 36-ohm quasi-linear resistive load line impedance per chip, simplifying the load matching network requirement for the complete 4-chip device. Additional benefits of the grounded-drain transistor of this invention are a reduced device output capacitance ($C_{OSS}$) and reduced feedback capacitances ($C_{RSS}$) in comparison with dies of other very large (100,000 square-mil) chip size and large (1000 V) breakdown voltage. This permits the transistor to achieve a respectable RF efficiency and RF gain at 13.56 MHz. The high symmetry and lowered parasitic reactances of the embodiments involving RF-oriented bond wiring and symmetrical distribution of the lead frame and bond wiring around the chip or die, also contribute to superior performance. The oval lead frame configuration achieves about a 3 dB nominal increase in 350 watt RF gain observed in reference to the same chip installed in a standard TO-247 device package.

Ultra-high efficiency of 90% to 95% per chip can be achieved using a sine-wave drive signal. Typical one-chip RF gains of 14 to 15 dB can be achieved at 350 watts, as compared with a typical 12 to 13 dB RF gain achieved with a large conventional (e.g., 35,000 square mil) low voltage single chip BJT devices.

The transistor chip of one embodiment of this invention has been observed to operate with an RF hot-spot thermal resistance of only about 0.3 degree C per watt, referenced to a power dissipation of 100 watts per transistor chip while operating at an output power of 350 watts per die. These chips also exhibit a safe load mismatch tolerance characterized by a high forward power output of 300 watts while driving the worst phase of a 5:1 VSWR load mismatch. This RF ruggedness characteristic is a key parameter needed for the severe applications intended.

Other multi-chip configurations are possible.

Also, while the arrangement of the above-described embodiment has been described in conjunction with an RF waveform frequency of 13.56 MHz, the invention can be used over a wide range of frequencies, including other RF frequencies such as 27.12 MHz, 40.68 MHz, etc.

FIG. 8 illustrates a single-chip amplifier arrangement showing RF current and signal paths of the kilowatt power transistor of this invention. Here, the amplifier for one of the four dies 14 is shown, with similar circuits being connected with the other three (or more) dies. An RF input circuit 41 receives an RF drive signal. A first die 14 has its 1 terminal, or gate, coupled through an internal gate resistor R2 to one terminal of an input transformer secondary TS, the other end being connected to the 2 terminal or source. The drain or 3 terminal is grounded to the flange. Source voltage-$V_{ss}$ is applied from a DC input through an RF choke L and resonant tank circuits 80 and 81 to the source or 2 terminal of the die. The DC input is RF grounded by means of capacitors 83 and 84. The RF output is supplied from the 2 terminal to the RF output terminal 42 through a series LC circuit 85.

Figure 10A:
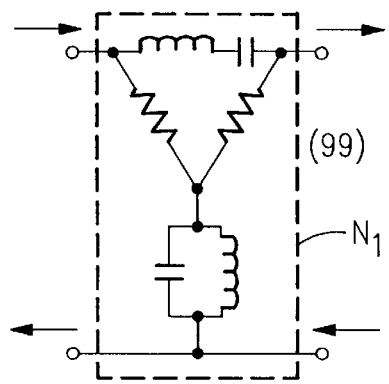
FIGS. 10A and 10B illustrate possible network harmonic and subharmonic filtering arrangements employed in implementations employing the transistor of this invention.
Figure 10B:
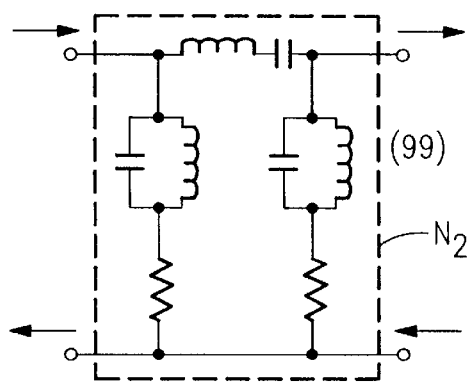

A four-chip Class $F_1$ amplifier circuit creating one type of kilowatt power transistor embodiment of this invention is shown schematically in FIG. 9, with reference to FIGS. 10A and 10B. FIG. 9 shows a complete practical implementation of a parallel arrangement employing four dies or chips. Here, the input transformer secondary TS supplies RF current from one end through respective gate resistors 91, 92, 93 and 94 to the gates or 1 terminals of the four dies 14; at the other end of the secondary TS being in common to each of the four sources or 2 terminals. The output signal appearing at the sources or 2 terminals is furnished through a parallel resonant third-harmonic tank circuit 95 and a series resonant circuit 96, operating just off resonance, to an output terminal. The sources or 2 terminals are supplied with DC power at a negative voltage-$V_{ss}$ via the third-harmonic resonator tank circuit 95, a second fundamentally resonant tank circuit 97, and an RF choke 98.

A network element 99 can be interposed ahead of the output terminal, and the element can take the form, generally, of a split-tee net F (FIG. 10A) or a three-section high-isolation pi network F (FIG. 10B). This functions as a dissipative bandpass filter, terminating both harmonic and subharmonic energy.

Figure 11:
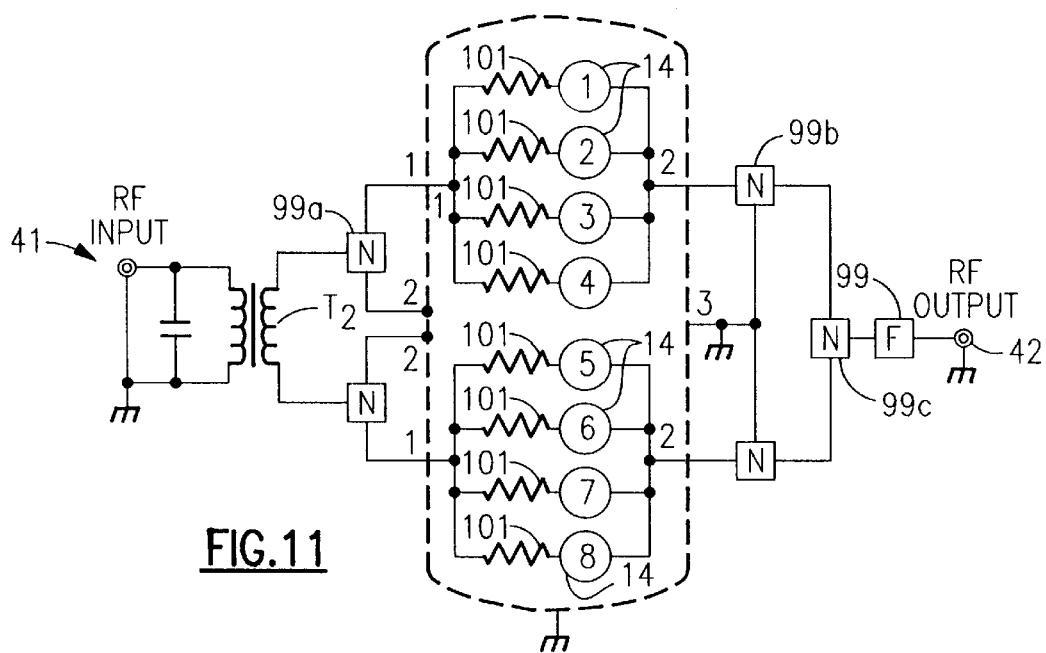
FIG. 11 is a schematic circuit diagram of a possible 8-chip array multi-kilowatt implementation.

FIG. 11 illustrates generally a parallel push-pull amplifier arrangement using a kilowatt power transistor device, and this can be constructed with the kilowatt power transistor arrangement, as generally presented in FIGS. 13 to 16.

Figure 13:
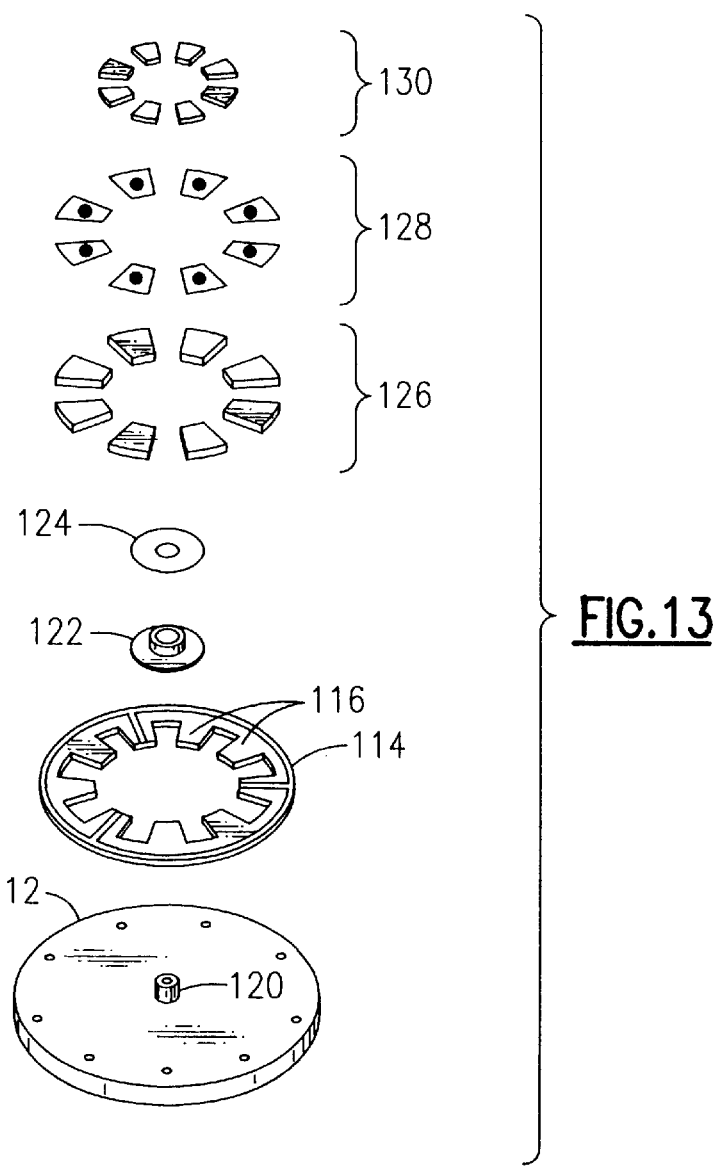
FIG. 13 is an exploded perspective view of a transistor device according to another embodiment of this invention, which can be employed as the device of either FIG. 11 or FIG. 12.

A third embodiment of this device is shown in FIGS. 13 to 16. This device is desgned to satisfy the electrical and mechanical symmetry requirements for substantially increased power levels beyond the configurations thus far described. A multi-kilowatt 3.0 kW device is illustrated in FIGS. 13. This configuration requires a substantial increase in transistor silicon, from four to nine dies. This embodiment is in a carousel or circular transistor configuration, to produce electrical an physical radial symmetry. This embodiment achieves superior performance at RF frequencies while minimizing parasitic reactances. It is particularly suitable for multi-kilowatt transistors requiring six to nine, or more, chips.

Figure 13A:
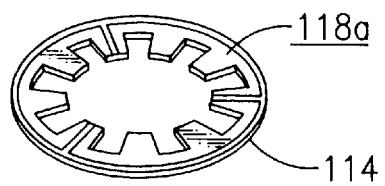
FIGS. 13A and 13B are perspective views of a metallized circular substrate of this embodiment.
Figure 13B:
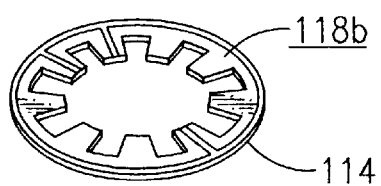

Here, as shown in exploded form in FIG. 13, is a flange member 112 formed as a disk of suitable material such a nickel plated copper. A notched ring 114 of a suitable insulating substrate has nine rectangular notches or cutouts 116, and has a metallized pattern 118a or 118b, as shown e.g., in FIGS. 13A and 13B. These patterns 118a and 118b are for ganging two sets of four dies or three sets of three dies, respectively. Many other metallization patterns are possible, depending on the transistor application.

Figure 14:
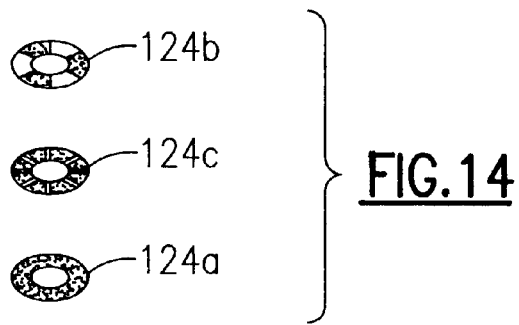
FIG. 14 shows another element of this embodiment.

There is an open-core mounting nipple 120 formed at the center of the flange 112, and a top-hat gate insulator 122 fits over this nipple. A gate terminal disk 124 fits over the post portion of the top-hat insulator 122. The disk 124 is formed of an insulator or dielectric, and has selected sectors thereof metallized, as required for the desired application. Several disk metallizations are illustrated in FIG. 14, e.g., a completely metallized disk 124a, a disk with three metallized sectors 124b, and a disk with nine metallized sectors 124c. In the last case, selected ones of the sectors can me joined using jumpers or wire bonds. Many alternative metallization patterns are possible.

Molybdenum tabs 126 are positioned on the flange 112 within the respective notches or cutouts 116 of the ring 114, and the nine dies 128 are mounted respectively on the tabs, e.g., by soldering. Gate resistors 130 are respectively situated radially inward of the respective dies 128.

The metallized portions of the ring 114 are connected by bonding wire (not shown) to the sources or 2 terminal regions of the respective dies 128, and the gate resistors are likewise connected to the 1 terminal regions, e.g., gates, of the associated dies 128.

Figure 15:
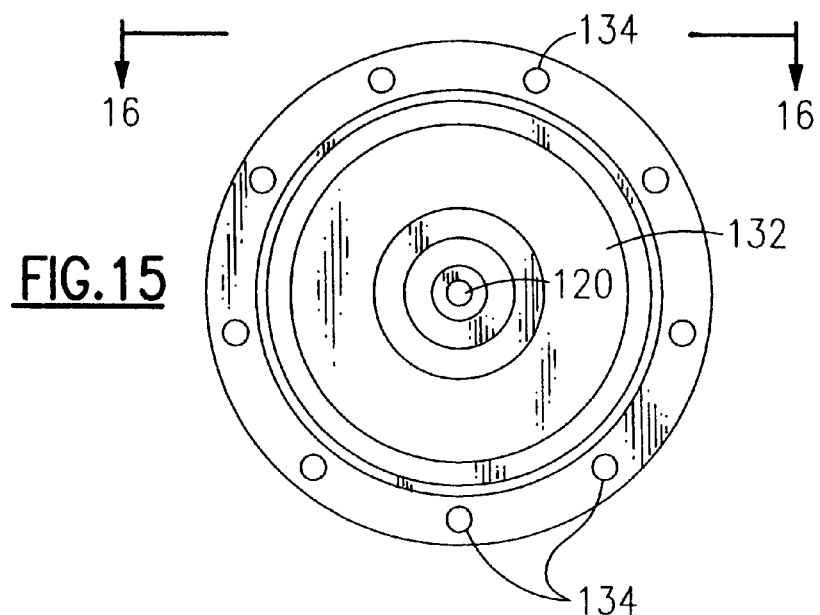
FIG. 15 is a plan view of the transistor device of this embodiment.
Figure 16:
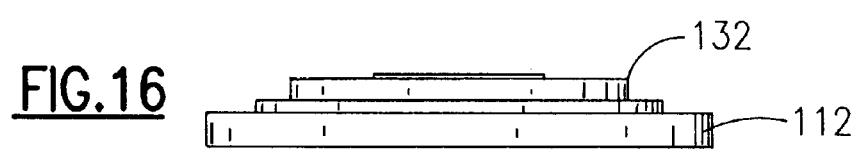
FIG. 16 is a side elevation at 16—16 of FIG. 15.

A cover 132 is attached in the position shown in FIGS. 15 and 16.

As shown in FIG. 15, there are nine mounting holes 134 provided on the rim of the flange 112, at 40-degree intervals. The holes 134 receive threaded fasteners to attach to an associated heat sink, e.g., a portion of a chassis of the amplifier. Another threaded fastener is inserted through the central nipple 120. This symmetrical arrangement, with each hole 134 aligned with a die 128, ensures that even pressure is applied between the flange and the chassis to keep the grounding as symmetrical as possible and to optimize ground currents.

The parallel push-pull amplifier arrangement of FIG. 11 employs a transistor having eight transistor dies 14 mounted on a single flange, but configured into two sets for four dies each.

Here, the four dies 14 each have respective input resistances 101 connected to their gates or 1 terminals, and with input networks 99a interposed between the input transformer secondary TS and the sources or 2 terminals for respective sets of four dies. The two sets have their respective 2 terminals connected to inputs of upper and lower networks 99b, which are connected also to ground and to respective inputs of an output network 99c, which supplies the RF output. The nets 99a, 99b, and 99c can be configured as in FIG. 10A or 10B.

Figure 12:
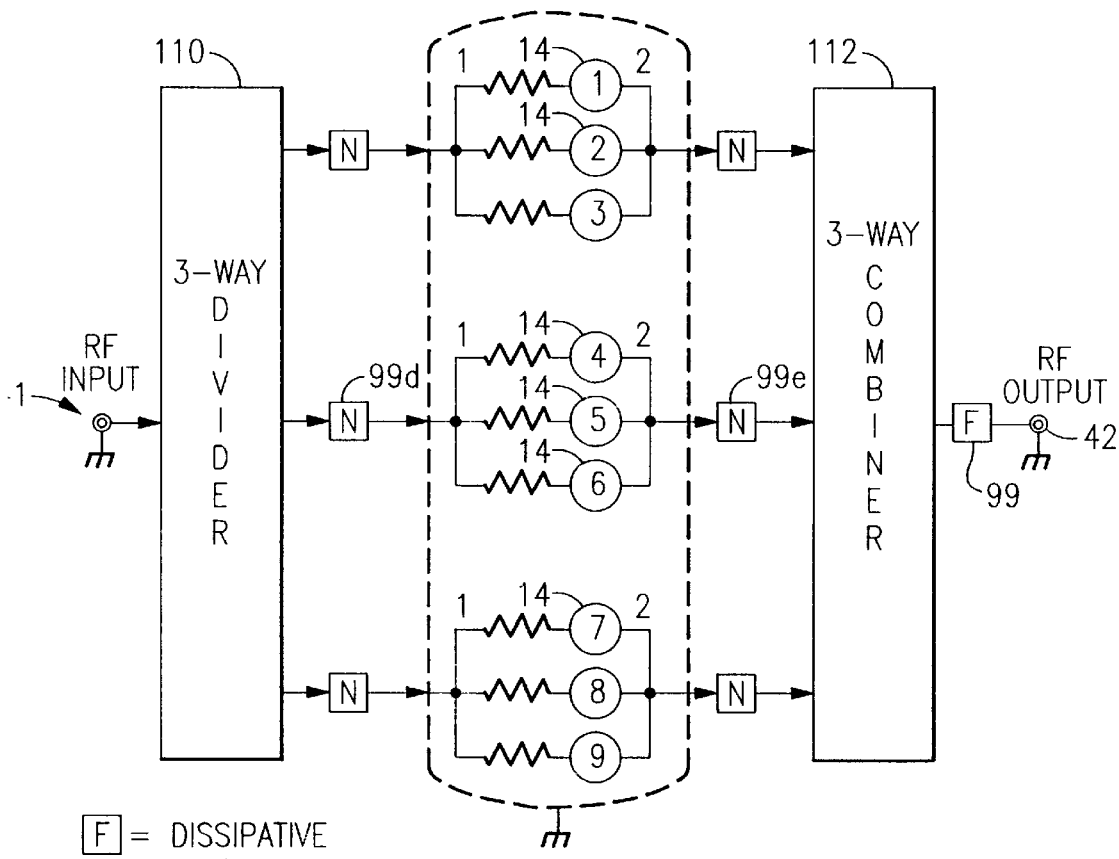
FIG. 12 is a schematic circuit diagram of a possible 9-chip array multi-kilowatt implementation.

FIG. 12 shows a multi-kilowatt nine-chip transistor RF amplifier circuit in which three sets of three dies each are connected in parallel. Here, the RF input signal flows from the RF input into a three-way divider 110, which has three outputs coupled through respective networks 99d to joined 1 terminal inputs for groups of three transistor dies 14. These dies have their 2 terminals joined in like manner and supply amplified RF output signal through respective network elements 99e to inputs of a three-way combiner 113. The dissipative bandpass filter network element 99 at the output can be configured as shown in FIG. 10A or 10B, e.g., as a split tee or as a pi network.

Figure 17:
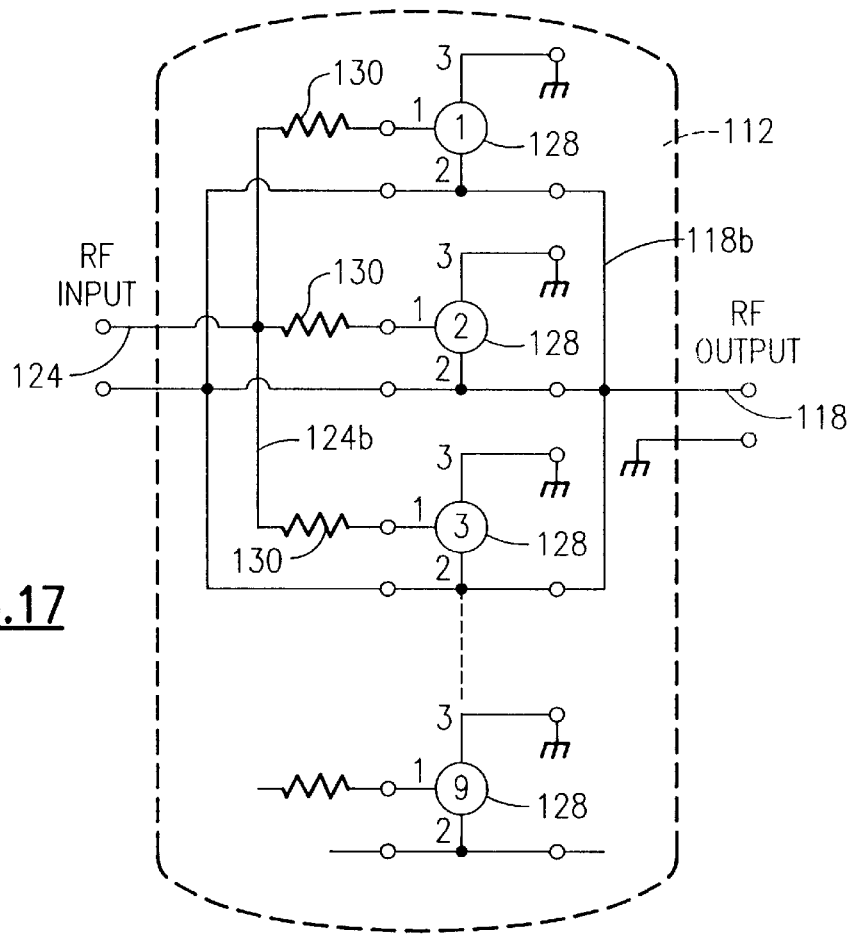
FIG. 17 is a schematic circuit diagram of an implementation of this embodiment.
Figure 18:
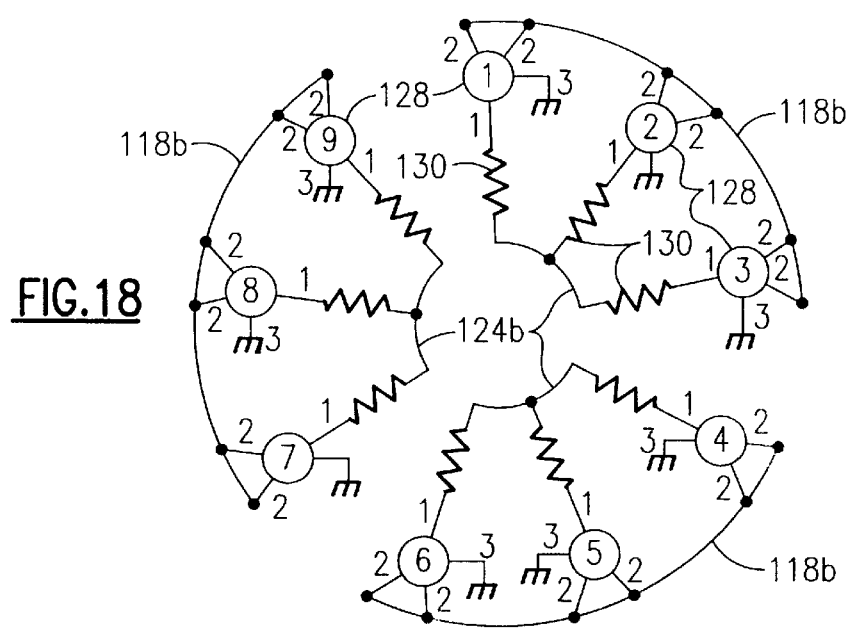
FIGS. 18 and 19 are schematic views of variations of the transistor device of this embodiment.

One electrical representation of the carousel-type transistor device of FIGS. 13 to 16, having radial symmetry geometry, is shown schematically in FIG. 17. In this implementation, the transistor is formed as three groups of three dies each. Here the RF input is applied via the metallized sectors of the gate disk 124b and the resistors 130 to the gate or 1 terminals of the dies 128. The metallization 118b of the ring 114 likewise joins the sources or 2 terminals of the three dies to an RF output. The drains or 3 terminals are grounded to the flange. A circular (structurally significant) schematic of this transistor appears in FIG. 18, showing the circumferentially symmetrical arrangement of the three groups of three transistor dies 128, with the radial arrangement of the gate disk metallization 124b, gate resistors 130, dies 128, and ring metallization pattern 118b.

Figure 19:
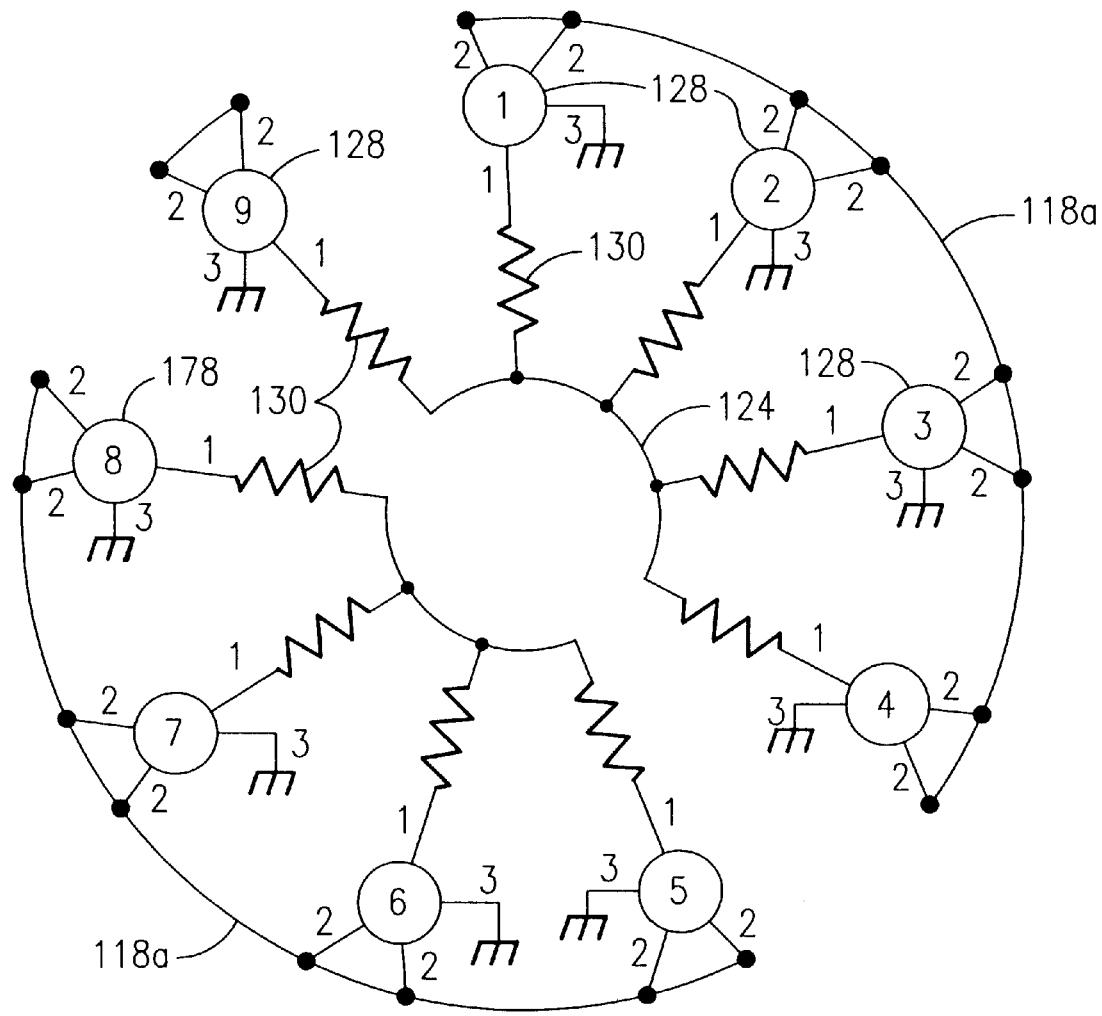

FIG. 19 schematically illustrates an alternative implementation of the nine-chip transistor of this embodiment, in this case with the gate disk 124 and the metallization 118a of the ring 114 being selected to configure the nine-chip transistor as two sets of four dies each, with the ninth die being disconnected from the circuit. Many other implementations are possible.

The kilowatt power transistor of the foregoing kilowatt to multi-kilowatt embodiments simplifies the construction and improves the reliability of high power (1.25 to 10 kW, and higher) RF generators and amplifiers. Combining circuits on the outputs are simplified or eliminated. This includes FETs such as MOSFETs and J-FETs, Bipolar Junction Transistors, both single BJT design, monolithic power darlington design, and insulated gate bipolar junction transistor (IGBT). Chip materials can be classic high Rho-T product silicon, although more exotic semiconductor materials can be used. The transistor amplifier can be implemented in all relevant classes of operation, that is Class A, AB, B, C, D, E, and F, including subclasses F1, F2, F3, and F4, as well as pulse mode.

All three fundamental RF functions can be served by the concepts described: 1) RF power amplifiers; 2) RF power oscillators; 3) RF power frequency multipliers; 4) RF compound function devices possessing a combination of two or more of the above RF functions. For example, one chip of the KPT may function as a power oscillator, with the balance of the chips functioning as a power amplifier. The oscillator provides the RF source for driving the power amplifier. Since the chips operate with grounded 3 terminals, the zero phase shift required for a power oscillator is automatically created by the application of the feedback necessary to the 1–3 terminals.

While the invention has been described with reference to a preferred embodiment, the invention is certainly not limited to that precise embodiment. Rather, many modifications and variations would present themselves to persons skilled in the art without departing from the scope and spirit of the invention, as defined in the appended claims.

I claim:

1. High-power high-voltage large chip transistor comprising a thermally and electrically conductive flange having a flat upper surface; a semiconductor die having a flat lower surface with an electrode terminal 3 region formed over a majority of said lower surface, an electrode terminal 1 region and an electrode terminal 2 region formed respectively on portions of said die away from said flat lower surface; a terminal 2 lead isolated from said flange and electrically connected to said electrode terminal 2 region; a terminal 1 lead isolated from said flange and electrically connected to said electrode terminal 1 region; and means for seating said electrode terminal 3 region in direct electrical and thermal contact with said flange, said means for seating including means for protecting said semiconductor die from thermal stresses, said flange serving as a terminal 3 lead for said die; wherein said die has a breakdown voltage between the terminal 2 and terminal 3 regions on the order of one kilovolt or higher; wherein said lower flat surface of said die has an area of approximately one hundred thousand square mils or larger; and wherein said electrode terminal 3 region is metallized over substantially the entire surface thereof.

2. High-power high-voltage large chip transistor comprising a thermally and electrically conductive flange having a flat upper surface; a semiconductor die having a flat lower surface with an electrode terminal 3 region formed over a majority of said lower surface, an electrode terminal 1 region and an electrode terminal 2 region formed respectively on portions of said die away from said flat lower surface; a terminal 2 lead isolated from said flange and electrically connected to said electrode terminal 2 region; a terminal 1 lead isolated from said flange and electrically connected to said electrode terminal 1 region; and means for seating said electrode terminal 3 region in direct electrical and thermal contact with said flange, said flange serving as a terminal 3 lead for said die; wherein said die has a breakdown voltage between the terminal 2 and terminal 3 regions on the order of one kilovolt or higher; wherein said lower flat surface of said die has an area of approximately one hundred thousand square mils or larger; and wherein said electrode terminal 3 region is metallized over substantially the entire surface thereof, wherein said means for seating said electrode terminal 3 region includes a molybdenum tab soldered between said electrode terminal 3 region and said flange.

3. High-power high-voltage large chip transistor comprising a thermally and electrically conductive flange having a flat upper surface; a multi-chip array formed of a plurality of semiconductor dies, each having a flat lower surface with an electrode terminal 3 region formed over a majority of said lower surface, an electrode terminal 1 region and an electrode terminal 2 region formed respectively on portions of said die away from said flat lower surface; a plurality of terminal 2 leads isolated from said flange and electrically connected to the electrode terminal 2 regions of respective ones of said dies; a plurality of terminal 1 leads isolated from said flange and electrically connected to the electrode terminal 1 regions of respective ones of said dies; and means for seating the electrode terminal 3 regions of said dies in direct electrical and thermal contact with said flange, said means for seating including means for protecting said semiconductor die from thermal stresses, said flange serving as a terminal 3 lead for said dies; wherein each said die has a breakdown voltage between the respective terminal 2 and terminal 3 regions on the order of one kilovolt or higher; wherein the lower flat surface of said die has an area of approximately one hundred thousand square mils or larger; and wherein each said drain region is metallized over substantially the entire surface thereof.

4. High-power transistor according to claim 3 wherein there are at least four of said dies positioned on said flange.

5. High-power high-voltage large chip transistor according to claim 3, wherein said dies are MOSFET transistor dies, and said electrode terminal 1, 2, and 3 regions respectively are gate, source, and drain regions.

6. A high-power grounded drain common source RF amplifier circuit comprising an input terminal, a supply of DC voltage, a load device, and a high-power high-voltage large chip transistor which includes a thermally and electrically conductive flange having a flat upper surface; a semiconductor die having a flat lower surface with a drain region formed over a majority of said lower surface, a gate region and a source region formed respectively on portions of said die away from said flat lower surface; a source lead isolated from said flange and electrically connecting said supply of DC voltage and said load device to said source region; a gate lead isolated from said flange and electrically coupling said input terminal to said gate region; and means for seating said drain region in direct electrical and thermal contact with said flange, said means for seating including means for protecting said semiconductor die from thermal stresses, said flange serving as a drain lead for said die; wherein said die has a drain-source breakdown voltage on the order of one kilovolt or higher; wherein said lower flat surface of said die has an area of approximately one hundred thousand square mils or larger; and wherein said drain region is metallized over substantially the entire surface thereof; and a heat sink on which said flange is mounted for drawing heat from said transistor.

7. The high-power grounded drain common source RF amplifier according to claim 6 further comprising a DC isolating stage between said input terminal and said gate electrode so that the input signal applied thereto is floating with respect to said drain region.

8. The high-power grounded drain common source RF amplifier according to claim 6 wherein said supply provides said DC power to said source at substantially −160 volts or more.

9. High-power high-voltage large chip transistor comprising a thermally and electrically conductive flange having a flat upper surface; a semiconductor die having a flat lower surface with an electrode terminal 3 region formed over a majority of said lower surface, an electrode terminal 1 region and an electrode terminal 2 region formed respectively on portions of said die away from said flat lower surface; means for seating said electrode terminal 3 region in direct electrical and thermal contact with said flange, said flange serving as a terminal 3 lead for said die; wherein said die has a breakdown voltage between the terminal 2 and terminal 3 regions on the order of one kilovolt or higher; wherein said lower flat surface of said die has an area of approximately one hundred thousand square mils or larger; and wherein said electrode terminal 3 region is metallized over substantially the entire surface thereof; and a lead frame arrangement seated on said flange, including an insulator body, a metal surround on said body centered on said die and having an opening therein to accommodate said die, said opening continuing centered thereon through said insulator body, a terminal 2 lead on said body in intimate electrical contact with said surround, a terminal 1 lead on said body isolated from said surround, wire bond means electrically connecting the surround to said electrode terminal 2 region of said die, and wire bond means electically connecting the terminal 1 lead to said electrode terminal 1 region on said die.

10. High-power high-voltage large chip transistor comprising a thermally and electrically conductive flange in the form of a disk having a flat upper surface; a multi-chip array formed of a plurality of semiconductor dies arranged circumferentially at angular intervals on the flange, each die having a flat lower surface with an electrode terminal 3 region formed over a majority of said lower surface, an electrode terminal 1 region and an electrode terminal 2 region formed respectively on portions of said die away from said flat lower surface; an annular terminal 2 lead frame having an insulator layer and a metal layer isolated from said flange, means electrically connecting the metal layer of said annular terminal 2 lead to the electrode terminal 2 regions of respective ones of said dies; terminal 1 means connected to the electrode terminal 1 regions of said respective dies; said flange serving as a terminal 3 lead for said dies; wherein each said die has a breakdown voltage between the respective terminal 2 and terminal 3 regions on the order of one kilovolt or higher; wherein the lower flat surface of said die has an area of approximately one hundred thousand square mils or larger; and wherein each said electrode terminal 3 region is metallized over substantially the entire surface thereof.

11. High-power high-voltage large chip transistor comprising a thermally and electrically conductive flange having a flat upper surface; a multi-chip array formed of a plurality of semiconductor dies, each having a flat lower surface with an electrode terminal 3 region formed over a majority of said lower surface, an electrode terminal 1 region and an electrode terminal 2 region formed respectively on portions of said die away from said flat lower surface; a plurality of terminal 2 leads isolated from said flange and electrically connected to the electrode terminal 2 regions of respective ones of said dies; said flange serving as a terminal 3 lead for said dies; wherein each said die has a breakdown voltage between the respective terminal 2 and terminal 3 regions on the order of one kilovolt or higher; wherein the lower flat surface of said die has an area of approximately one hundred thousand square mils or larger; and wherein each said drain region is metallized over substantially the entire surface thereof; and a lead frame arrangement seated on said flange, including an insulator body, a plurality of metal surrounds on said body, each being centered on a respective one of said dies and having an opening therein to accommodate the associated die, said openings continuing centered thereon through said insulator body, a plurality of terminal 2 leads on said body in intimate electrical contact with a respective one of said surrounds, a plurality of terminal 1 lead on said body isolated from said surrounds, wire bond means electrically connecting the surround to said electrode terminal 2 region of the associated die, and wire bond means electically connecting the terminal 1 lead to said electrode terminal 1 region on the associated die.

\* \* \* \* \*